(12) United States Patent
Kato (10) Patent No.: US 9,343,311 B2
(45) Date of Patent: May 17, 2016

(54) SUBSTRATE TREATMENT METHOD (71) Applicant: SCREEN Holdings Co., Ltd., Kyoto (JP)

(72) Inventor: Shinichi Kato, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/408,390

(22) PCT Filed: Jun. 5, 2013

(86) PCT No.: PCT/JP2013/065571
§ 371 (c)(1),
(2) Date: Dec. 16, 2014

(87) PCT Pub. No.: WO2014/013809
PCT Pub. Date: Jan. 23, 2014

(65) Prior Publication Data
US 2015/0206751 A1    Jul. 23, 2015

(30) Foreign Application Priority Data

Jul. 19, 2012  (JP) ................................ 2012-160393

(51) Int. Cl.
*H01L 21/30* (2006.01)
*H01L 21/228* (2006.01)
(Continued)

(52) U.S. Cl.
CPC ........ *H01L 21/228* (2013.01); *H01L 21/02046* (2013.01); *H01L 21/02321* (2013.01);
(Continued)

(58) Field of Classification Search
CPC ................. H01L 21/02109; H01L 21/02225; H01L 21/02227; H01L 21/38; H01L 21/388; H01L 21/40; H01L 21/46
See application file for complete search history.

(56) References Cited

U.S. PATENT DOCUMENTS 5,840,589 A * 11/1998 Warner et al. ................. 438/478
2009/0004806 A1 * 1/2009 Siprak .......................... 438/306
(Continued)

FOREIGN PATENT DOCUMENTS

JP     61-193456     8/1986
JP     2002-343800   11/2002
(Continued)

OTHER PUBLICATIONS

International Search Report mailed Aug. 20, 2013 in corresponding PCT International Application No. PCT/JP2013/065571.
(Continued)

*Primary Examiner* — Cheung Lee
(74) *Attorney, Agent, or Firm* — Ostrolenk Faber LLP (57) ABSTRACT

A substrate having a native oxide film formed on its surface is heated in a hydrogen atmosphere to reduce silicon dioxide to hydrogen. Additionally, silicon near an interface between the native oxide film and the substrate is hydrogen-terminated. A hydrogen-introduced layer containing silicon bonded with hydrogen is accordingly formed on the substrate surface. A dopant solution is supplied to the substrate surface having the hydrogen-introduced layer formed thereon, and hydrogen in the hydrogen-introduced layer is replaced with a dopant, thereby introducing the dopant into the substrate surface. A relatively large thickness of the hydrogen-introduced layer formed through the reduction of the native oxide film allows the dopant to be uniformly introduced into the substrate surface for a required depth. A flashing light is emitted to the substrate surface containing the introduced dopant, activating the dopant.

4 Claims, 6 Drawing Sheets (51) Int. Cl.
*H01L 21/02* (2006.01)
*H01L 21/306* (2006.01)
*H01L 21/324* (2006.01)
*H01L 21/268* (2006.01)
*H01L 21/67* (2006.01)

(52) U.S. Cl.
CPC ........ *H01L21/2686* (2013.01); *H01L 21/3003* (2013.01); *H01L 21/306* (2013.01); *H01L 21/324* (2013.01); *H01L 21/67115* (2013.01)

(56) References Cited

U.S. PATENT DOCUMENTS

| | | | |
|---|---|---|---|
| 2010/0006907 A1* | 1/2010 | Itokawa | 257/288 |
| 2012/0003826 A1* | 1/2012 | Pollard et al. | 438/542 |
| 2012/0085941 A1 | 4/2012 | Shibata | 250/492.21 |

FOREIGN PATENT DOCUMENTS

| | | |
|---|---|---|
| JP | 2004-079794 | 3/2004 |
| JP | 2004-087960 | 3/2004 |
| JP | 2005-228792 | 8/2005 |
| JP | 2010-056189 | 3/2010 |
| JP | 2012-082462 | 4/2012 |
| WO | WO 2011/112546 A1 | 9/2011 |

OTHER PUBLICATIONS

Johnny C. Ho et al., "Controlled nanoscale doping of semiconductors via molecular monolayers," Nature Materials, vol. 7, pp. 62-67 & S1-S10, Jan. 2008.

International Preliminary Report on Patentability (IPRP) issued by the IPEA/EP Patent Office on Jan. 29, 2015 in connection with corresponding application PCT/JP2013/065571.

* cited by examiner

SUBSTRATE TREATMENT METHOD

CROSS-REFERENCE TO RELATED APPLICATIONS

The present application is a 35 U.S.C. §§371 national phase conversion of PCT/JP2013/065571, filed Jun. 5, 2013, which claims priority to Japanese Patent Application No. JP2012-160393, filed Jul. 19, 2012, the contents of which are incorporated herein by reference. The PCT International Application was published in the Japanese language.

TECHNICAL FIELD

The present invention relates to a substrate treatment method for introducing a dopant such as boron to a surface of a substrate such as a silicon semiconductor wafer.

BACKGROUND ART

In the process of manufacturing a semiconductor device, the introduction of impurities (dopant) is a step required for forming a p-n junction in a semiconductor wafer. Currently, impurities are generally introduced by ion implantation and subsequent annealing. Ion implantation is a technique of ionizing elements of impurities such as boron (B), arsenic (As), or phosphorous (P) to collide the ions with a silicon semiconductor substrate at high acceleration voltage, thereby physically implanting impurities (for example, see Patent Document 1). The implanted impurities are activated through annealing.

Traditionally performed ion implantation has an advantage of easily controlling the implantation depth and concentration of impurities in the introduction of impurities. The increasingly smaller sizes of semiconductor devices, however, require the introduction of impurities in only an extremely shallow region (with a depth not greater than several nm) of a surface layer of the substrate. Ion implantation has difficulty in implanting impurities in only such an extremely shallow surface layer region. The 3D transistor technology, which has been under development, needs to introduce impurities into a concavo-convex three-dimensional pattern. It is therefore difficult to uniformly introduce impurities into the entire surface of the concavo-convex pattern by ion implantation of colliding ions from one direction.

Under the circumstances, the following technique has been researched, which supplies a dopant-containing chemical solution to the surface of the silicon substrate by a wet treatment and diffuses the dopant in a substrate surface layer by a subsequent heat treatment, thereby introducing impurities into only an extremely shallow region of the substrate surface layer (see Non-Patent Document 1). In the technique disclosed in Non-Patent Document 1, a native oxide film is removed from the surface of the silicon substrate with a dilute hydrofluoric acid, the hydrogen termination treatment is then performed to stabilize the surface state, and then, a dopant-containing chemical solution is supplied to the hydrogen-terminated substrate surface. Such a combination of the wet treatment and the thermal diffusion allows the introduction of impurities into only an extremely shallow region of the surface layer of the substrate, and also allows impurities to be uniformly introduced into the entire surface of a complex concavo-convex pattern.

PRIOR ART DOCUMENTS

Patent Document

Patent Document 1: Japanese Patent Application Laid-Open No. 2012-82462

Non-Patent Document

Non-Patent Document 1: JOHNNY C. HO, ROIE YERUSHALMI, ZACHERY A. JACOBSON, ZHIYONG FAN, ROBERT L. ALLEY and ALI JAVEY, "Controlled nanoscale doping of semiconductors via molecular monolayers, nature materials," Nature Publishing Group, vol. 7, pp. 62-67, published online on Nov. 11, 2007

SUMMARY OF INVENTION

Problem to be Solved by the Invention

Unfortunately, when the hydrogen termination is performed after a native oxide film is removed with a dilute hydrofluoric acid as disclosed in Non-Patent Document 1, the hydrogen termination is not achieved up to a depth that requires the introduction of a dopant, and moreover, the hydrogen termination is not achieved uniformly on the entire substrate surface. Even if a dopant-containing chemical solution is supplied to the substrate surface in such a state, the dopant cannot be introduced uniformly for a required depth.

The present invention has been made in view of the above-mentioned problem, and an object thereof is to provide a substrate treatment method capable of uniformly introducing a dopant into a substrate surface for a required depth.

Means for Solving the Problem

To solve the above-mentioned problem, a first aspect of the present invention relates to a substrate treatment method for introducing a dopant into a surface of a silicon substrate, which includes: a hydrogen annealing step of heating a substrate having an oxide film formed on a surface thereof in a hydrogen-containing atmosphere to reduce the oxide film with hydrogen and hydrogen-terminate silicon at an interface between the oxide film and the substrate; and an introduction step of supplying a dopant-containing chemical solution to the surface of the substrate to introduce the dopant into the surface after the hydrogen annealing step.

In a second aspect, in the substrate treatment method according to the first aspect, the hydrogen annealing step heats a substrate having an oxide film formed on a surface thereof at 600° C. or higher and 1300° C. or lower for 30 minutes or more and 60 minutes or less in an atmosphere having a hydrogen concentration of 4% or higher and 10% or lower.

In a third aspect, in the substrate treatment method according to the first or second aspect, the hydrogen is deuterium.

In a fourth aspect, the substrate treatment method according to any one of the first to third aspects further includes an activation step of emitting a flashing light to the surface of the substrate to activate the introduced dopant after the introduction step.

Effects of the Invention

According to the substrate treatment method for the first to fourth aspects, the substrate having an oxide film formed on its surface is heated in a hydrogen-containing atmosphere to reduce the oxide film with hydrogen, and the silicon at the interface with the oxide film and the substrate is hydrogen-terminated. This allows a hydrogen-introduced layer containing silicon bonded to hydrogen to be formed on the substrate surface with a thickness equal to or larger than that of the oxide film. Supplying a dopant-containing chemical solution to the substrate surface, on which the hydrogen-introduced layer is formed, allows the replacement of hydrogen with a dopant, thereby uniformly introducing the dopant into the substrate surface for a required depth.

Particularly according to the substrate treatment method for the fourth aspect, a flashing light is emitted to the substrate surface to activate the introduced dopant, enabling the activation of the dopant while suppressing the dopant from dispersing outward.

DESCRIPTION OF EMBODIMENT

Hereinafter, an embodiment of the present invention will be described in detail with reference to the drawings.

Figure 1:
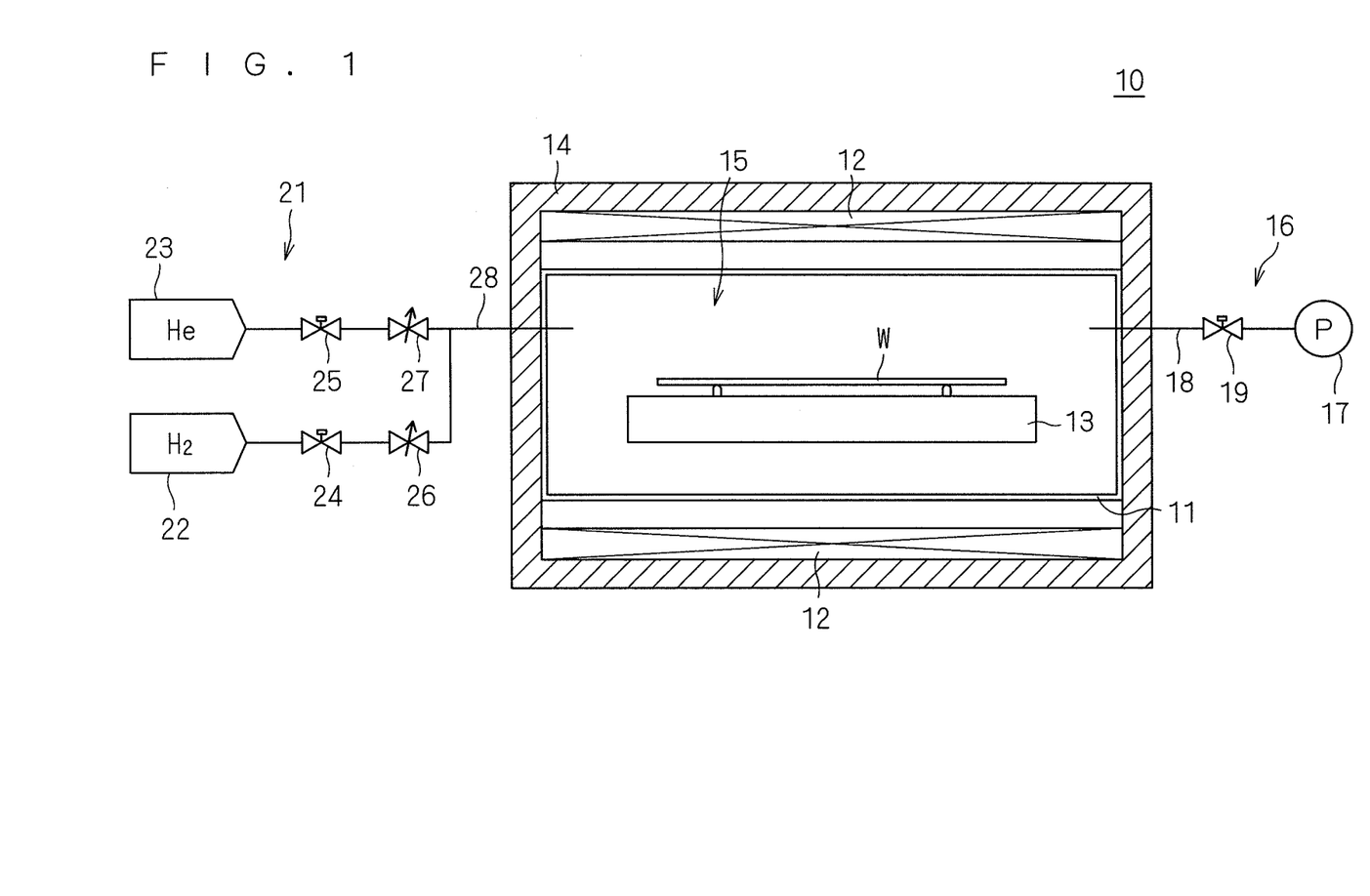
FIG. 1 shows a schematic configuration of an atmosphere furnace.

First, each substrate treating apparatus to be used in performing a substrate treatment method according to the present invention is outlined. FIG. 1 shows a schematic configuration of an atmosphere furnace 10. The atmosphere furnace 10 is a substrate treating apparatus that heats a substrate W in a hydrogen atmosphere. The atmosphere furnace 10 includes a reaction vessel 11 and heating elements 12 inside a furnace body 14. The atmosphere furnace 10 also includes a processing gas supply mechanism 21 that supplies a processing gas containing a hydrogen gas ($H_2$) into the reaction vessel 11 and an exhaust mechanism 16 that exhausts a gas from the reaction vessel 11.

The furnace body 14 of the atmosphere furnace 10 is a housing formed of a material having excellent heat resistance, such as ceramics. The reaction vessel 11 is placed inside the furnace body 14 and accommodates the substrate W. The reaction vessel 11 is preferably formed of a material having excellent heat resistance and poor reactivity with hydrogen (such as alumina ($Al_2O_3$)). Provided inside the reaction vessel 11 is a substrate holder 13 that holds the substrate W. The substrate holder 13 is preferably formed of a material having excellent heat resistance and poor reactivity, similarly to the reaction vessel 11.

Made in the reaction vessel 11 is an opening (not shown) and, through this opening, the substrate W can be transported into and out of the reaction vessel 11. With the opening of the reaction vessel 11 being closed, the interior of the reaction vessel 11 serves as a treatment space 15 that is hermetically sealed.

The heating elements 12 are disposed around the reaction vessel 11 inside the furnace body 14. The heating element 12 is a resistive heating element (such as a molybdenum heater) that generates heat through energization. Although the heating elements 12 are provided above and under the reaction vessel 11 in FIG. 1, the heating elements 12 may be provided to the sides of the reaction vessel 11.

The processing gas supply mechanism 21 includes a hydrogen gas supply source 22, an inert gas supply source 23, valves 24 and 25, flow regulating valves 26 and 27, and a supply tube 28. The distal-end side of the supply tube 28 is connected in communication with the treatment space 15 in the reaction vessel 11. The proximal-end side of the supply tube 28 is branched into two portions, one of which being connected to the hydrogen gas supply source 22 and the other being connected to the inert gas supply source 23. Of the path of the supply tube 28, which is branched into two portions, the valve 24 and the flow regulating valve 26 are provided in the tube connected to the hydrogen gas supply source 22, whereas the valve 25 and the flow regulating valve 27 are provided in the tube connected to the inert gas supply source 23.

When the valve 25 is opened, a helium gas (He) is supplied from the inert gas supply source 23 through the supply tube 28 to the treatment space 15. The flow rate of the helium gas to be supplied is regulated by the flow regulating valve 27. When the valve 24 is opened, a hydrogen gas is supplied from the hydrogen gas supply source 22 through the supply tube 28 to the treatment space 15. The flow rate of a hydrogen gas to be supplied is regulated by the flow regulating valve 26. When the valve 24 and the valve 25 are both opened, a gas mixture of a hydrogen gas and a helium gas is supplied to the treatment space 15 in the reaction vessel 11, forming a hydrogen atmosphere. In this specification, the "hydrogen atmosphere" refers to a hydrogen-containing atmosphere. The concentration of the hydrogen gas in the gas mixture is defined by the flow regulating valve 26 and the flow regulating valve 27 regulating the flow rates of a hydrogen gas and a helium gas to be supplied, respectively.

The exhaust mechanism 16 includes a vacuum pump 17, an exhaust tube 18, and a valve 19. The distal-end side of the exhaust tube 18 is connected in communication with the treatment space 15 in the reaction vessel 11, and the proximal-end side thereof is connected to the vacuum pump 17. The valve 19 is provided at some midpoint in the path of the exhaust tube 18. The valve 19 is opened with the vacuum pump 17 being operated, whereby the atmosphere of the treatment space 15 is exhausted out of the apparatus. Alternatively, without a gas supply from the processing gas supply mechanism 21, the exhaust mechanism 16 can evacuate the treatment space 15 through exhausting. The processing gas supply mechanism 21 and the exhaust mechanism 16 can control the atmosphere of the treatment space 15.

The atmosphere furnace 10 is provided with, for example, a densitometer that measures a hydrogen concentration in the treatment space 15, a temperature sensor that measures the temperature of the treatment space 15, and a cooling mechanism for preventing an overheat of the furnace body 14, in addition to the components described above.

Figure 2:
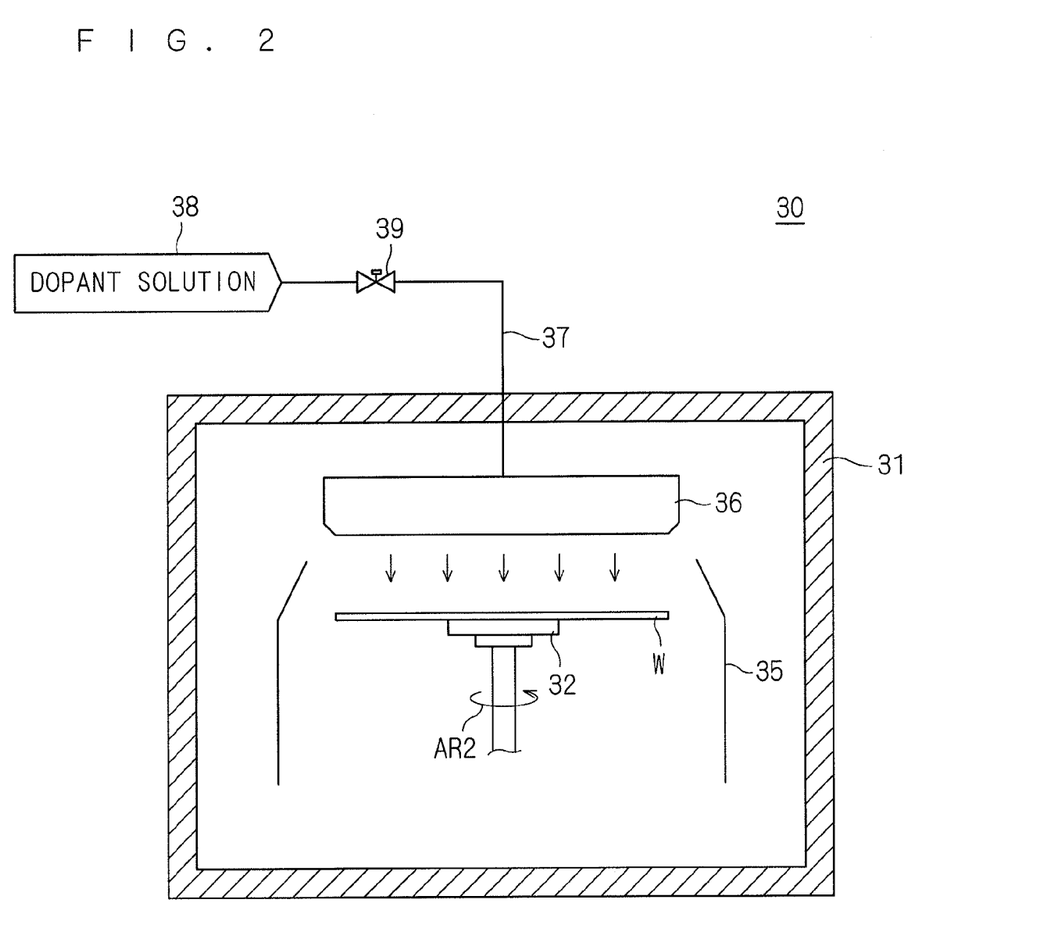
FIG. 2 shows a schematic configuration of a liquid supply apparatus.

FIG. 2 shows a schematic configuration of a liquid supply apparatus 30. The liquid supply apparatus 30 is the substrate treating apparatus that supplies a dopant-containing chemical solution (dopant solution) to the surface of the substrate W. The liquid supply apparatus 30 includes a spin chuck 32, a cup 35, a nozzle 36, or the like inside a housing 31. The housing 31 has an opening (not shown) and is provided with a shutter mechanism (not shown). With the opening being opened by the shutter mechanism, the substrate W is transported into and out of the liquid supply apparatus 30.

The spin chuck 32 adheres to the lower surface of the substrate W to hold the substrate W in substantially a horizontal position (a position in which the normal of the substrate W extends vertically). The spin chuck 32 is rotated about the vertically extending axis by a rotational drive mechanism (not shown), as indicated by the arrow AR2. The spin chuck 32 rotates while holding the substrate W, so that the substrate W also rotates in the horizontal plane.

The nozzle 36 is provided above the spin chuck 32. The nozzle 36 is a slit nozzle that has a slit-shaped ejection hole having a length not less than the diameter of the substrate W. The nozzle 36 is connected to a dopant solution supply source 38 via a liquid tube 37. The liquid tube 37 is provided with a valve 39. When the valve 39 is opened, a dopant solution is delivered from the dopant solution supply source 38 to the nozzle 36, and then, the dopant solution is discharged from the nozzle 36. The nozzle 36 is configured to slidably move in the direction perpendicular to the sheet of FIG. 2.

While slidably moving above the substrate W held on the spin chuck 32, the nozzle 36 supplies the dopant solution delivered from the dopant solution supply source 38 to the upper surface of the substrate W. Here, the "dopant solution" refers to the chemical solution containing a dopant being impurities to be introduced into the substrate W. Examples of the solution that can be used as the above-mentioned dopant solution include an allylboronic acid pinacol ester containing boron (B) as a dopant and a mixture of boron oxide ($B_2O_3$), an organic binder, and a solvent.

The cup 35 is provided to surround the spin chuck 32 and the substrate W held on the spin chuck 32. A dopant solution or the like, which is sprayed onto the surroundings from the rim portion of the substrate W rotated by the spin chuck 32, is collected by the cup 35.

Figure 3:
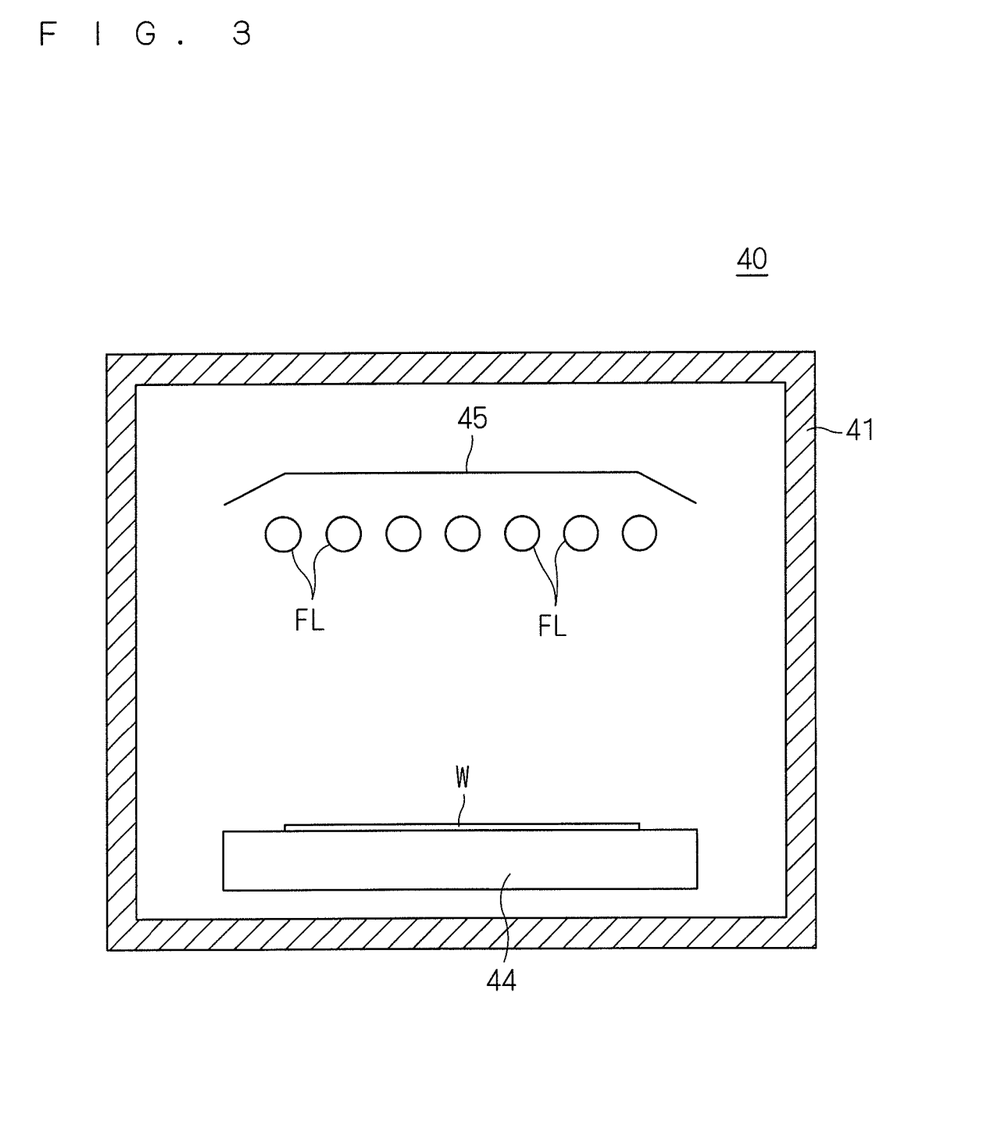
FIG. 3 shows a schematic configuration of a flash lamp annealer.

FIG. 3 shows a schematic configuration of a flash lamp annealer 40. The flash lamp annealer 40 is the substrate treating apparatus that emits a flashing light to the surface of the substrate W containing an introduced dopant and heats the substrate W, thereby activating the dopant. The flash lamp annealer 40 includes a mounting table 44, a plurality of flash lamps FL, and a reflector 45 inside a housing 41. The housing 41 has an opening (not shown) and is provided with a shutter mechanism (not shown). With the opening being opened by the shutter mechanism, the substrate W is transported into and out of the flash lamp annealer 40.

The mounting table 44 mounts and holds the substrate W thereon in the housing 41. The mounting table 44 has a heater built therein and can heat the mounted substrate W to a predetermined temperature.

The plurality of flash lamps FL are provided above the mounting table 44. The plurality of flash lamps FL, each of which is an elongated lamp having a cylindrical rod shape, are disposed over a plane to be parallel to the substrate W held on the mounting table 44. Each flash lamp FL includes a rod-shaped glass tube (discharge tube) and a trigger electrode. A xenon gas is sealed within the glass tube, and an anode and a cathode connected to a capacitor are disposed at both end portions of the glass tube. The trigger electrode is attached to an outer circumferential surface of the glass tube. Even when charges are stored in the capacitor, no electricity flows through the glass tube in a normal state because the xenon gas is electrically insulating. However, if high voltage is applied to the trigger electrode to cause an insulating breakdown, the electricity stored in the capacitor instantaneously flows through the glass tube, so that light is emitted through the excitation of atoms or molecules of xenon occurring at that time. In the above-mentioned xenon flash lamp FL, the electrostatic energy preliminarily stored in the capacitor is converted into an extremely short optical pulse of 0.1 to 100 milliseconds, leading to a feature of emitting extremely intense light compared to a light source for continuous lighting. An emission time period of the flash lamp FL can be adjusted depending on the coil constant of a power supply circuit that supplies electricity to the flash lamps FL.

The reflector 45 is provided above the plurality of flash lamps FL so as to cover the whole of the flash lamps FL. The basic function of the reflector 45 is to reflect flashing lights emitted from the plurality of flash lamps FL toward the mounting table 44.

The flash lamp annealer 40 may be provided with a mechanism that supplies, for example, a nitrogen gas into the housing 41, a mechanism that exhausts the atmosphere of the housing 41, or other mechanism, in addition to the above-mentioned components. The mounting table 44 may be provided with a heater as well as a mechanism that cools the substrate W, such as a water cooling tube.

Figure 4:
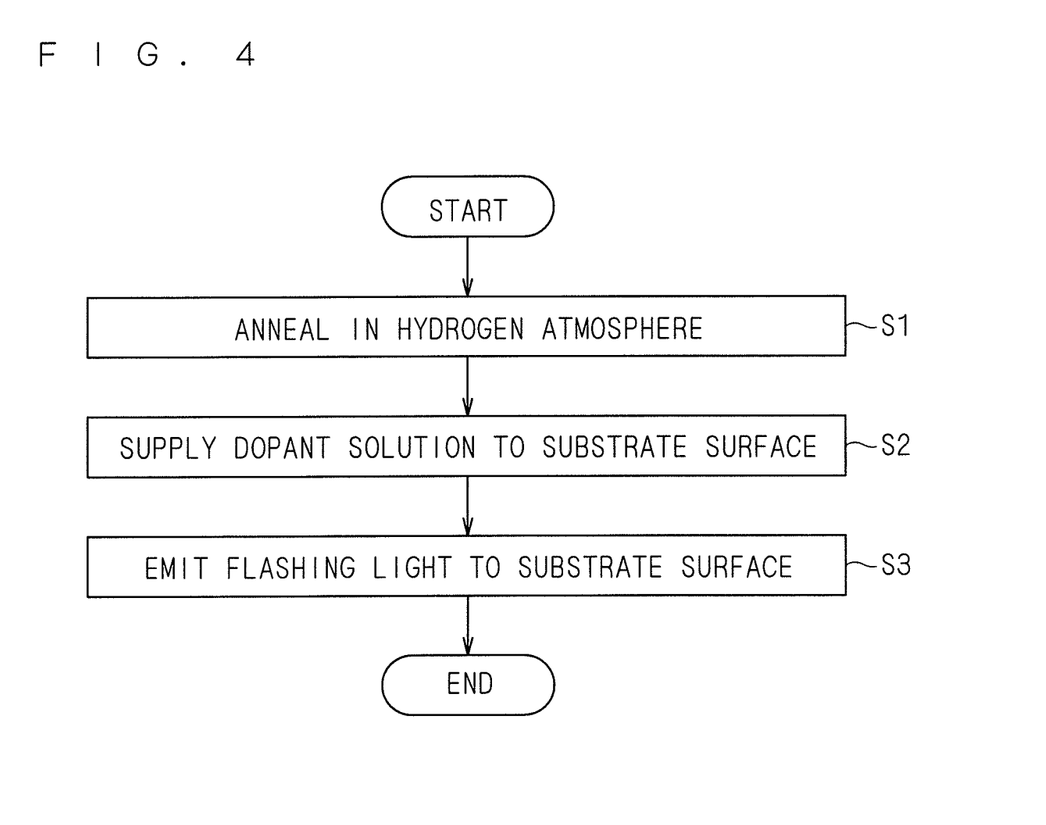
FIG. 4 is a flowchart showing a procedure of a substrate treatment method according to the present invention.

The procedure of treating the substrate W will be now described. FIG. 4 is a flowchart showing the procedure of the method for treating the substrate W according to the present invention. FIGS. 5A, 5B, 5C, 6A and 6B show how the state of the surface of the substrate W changes through the substrate treatment.

Figure 5A:
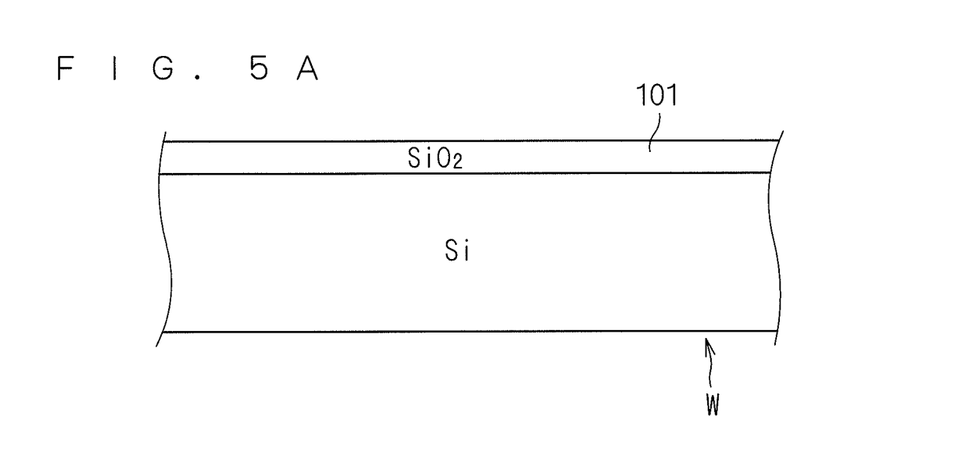
FIGS. 5A-5C show how a state of a substrate surface changes.

First, the substrate W is annealed in a hydrogen atmosphere in the atmosphere furnace 10 (Step S1). The substrate W in this embodiment is a silicon semiconductor wafer. As shown in FIG. 5A, a native oxide film 101 of silicon dioxide ($SiO_2$) is formed on the surface of the substrate W before being transported into the atmosphere furnace 10. The native oxide film 101 is a silicon dioxide film that is unavoidably formed as a result of the contact of the silicon exposed on the surface of the substrate W with oxygen in the air. In most cases, the native oxide film 101 of 2 to 3 nm is formed on the surface of the substrate W. The surface of the substrate W is a main surface in which a device pattern is formed, and a rear surface is the other main surface opposite to the above-mentioned main surface.

The substrate W having the native oxide film 101 formed on its surface as described above is transported into the reaction vessel 11 of the atmosphere furnace 10 and is held on the substrate holder 13. After the substrate W is transported, the opening of the reaction vessel 11 is closed so that the treatment space 15 becomes an enclosed space.

After that, the valve 19 is opened with the vacuum pump 17 being operated, so that air is exhausted from the treatment space 15 in the reaction vessel 11. Simultaneously with the above, the valve 24 and the valve 25 are both opened, so that a gas mixture of a hydrogen gas and a helium gas is supplied to the treatment space 15. As a result, a gasflow of the gas mixture of a hydrogen gas and a helium gas is formed in the reaction vessel 11, so that the atmosphere in the treatment space 15 is displaced with a hydrogen atmosphere. For higher displacement efficiency, the exhaust mechanism 16 may once evacuate the treatment space 15 with the valve 24 and the valve 25 being closed, and then, the valve 24 and the valve 25 may be opened to supply a gas mixture.

The flow rate of a hydrogen gas to be supplied to the treatment space 15 is regulated by the flow regulating valve 26, and the flow rate of a helium gas is regulated by the flow regulating valve 27. By adjusting a flow ratio of the flow rates, the concentration of the hydrogen gas in the gas mixture of the treatment space 15 can be defined. In this embodiment, the supply flow rates of a hydrogen gas and a helium gas are regulated such that the hydrogen concentration in the gas mixture of the treatment space 15 is higher than and equal to 4% and lower than and equal to 10% (where a unit of hydrogen concentration is vol. %).

After the formation of a hydrogen atmosphere whose hydrogen concentration is higher than or equal to 4% and lower than and equal to 10% in the treatment space 15, the heating elements 12 generate heat through energization to heat the whole of the treatment space 15 including the substrate W. In this embodiment, the substrate W is heated to a treatment temperature of 600° C. or higher and 1300° C. or lower. The heating time period (time period required for maintaining the substrate W at the treatment temperature) in the atmosphere furnace 10 is 30 minutes or more and 60 minutes or less.

Figure 5B:
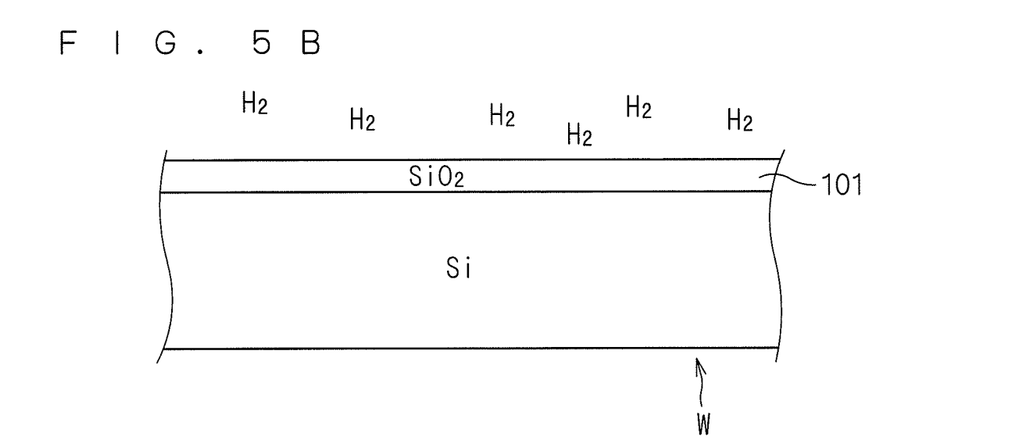
Figure 5C:
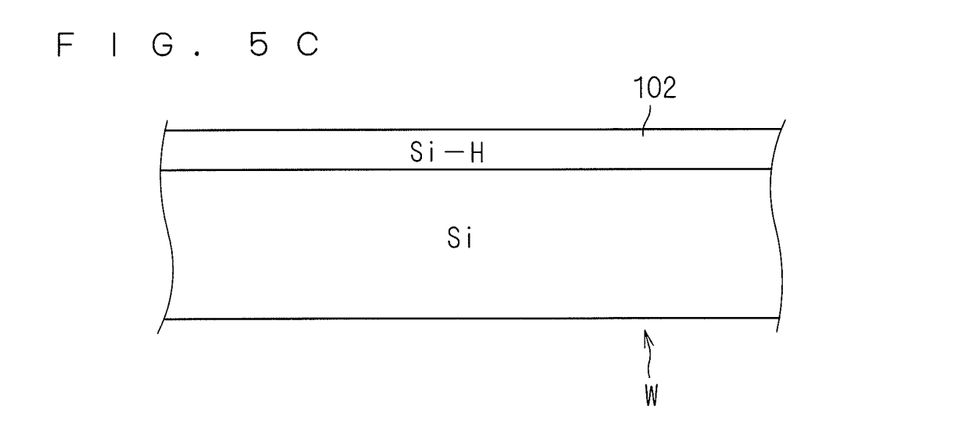

As shown in FIG. 5B, the substrate W having the native oxide film 101 formed thereon is heated to the treatment temperature of 600° C. or higher and 1300° C. or lower in a hydrogen atmosphere, promoting a hydrogen reduction reaction in which the silicon dioxide of the native oxide film 101 is reduced with hydrogen. Then, the substrate W is maintained at the treatment temperature for 30 minutes or more and 60 minutes or less in the hydrogen atmosphere, so that silicon dioxide is reduced with hydrogen in the whole of the native oxide film 101. Consequently, silicon is bonded to hydrogen. Further, the native oxide film 101 is reduced, and silicon dangling bonds near the interface between the native oxide film 101 and the underlying silicon are hydrogen-terminated. As a result, as shown in FIG. 5C, a hydrogen-introduced layer 102 containing silicon bonded to hydrogen is formed on the surface of the substrate W. Through annealing for 30 minutes or more and 60 minutes or less, the hydrogen-introduced layer 102 on the surface of the substrate W has a thickness of about 2 to 3 nm, which is substantially equal to that of the native oxide film 101. After a lapse of a predetermined heating time period, the energization of the heating element 12 is stopped, lowering the temperature of the substrate W.

Then, the substrate W that has been annealed in the hydrogen atmosphere is transported to the liquid supply apparatus 30, and a dopant solution is supplied to the surface of the substrate W (Step S2). The substrate W, which has the hydrogen-introduced layer 102 formed on its surface through annealing in the atmosphere furnace 10, is transported into the housing 31 of the liquid supply apparatus 30 and is then held in a position substantially horizontal to the spin chuck 32. The substrate W, whose surface facing upward, is held on the spin chuck 32.

Figure 6A:
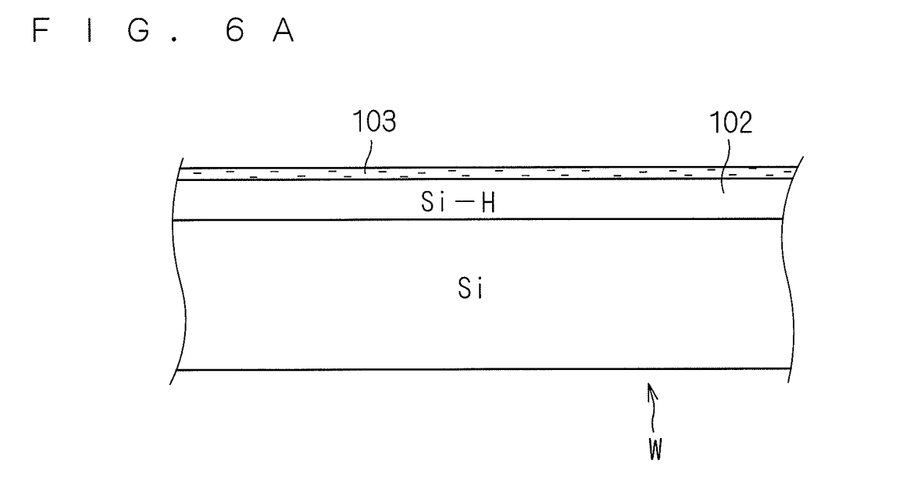
FIGS. 6A-6B show how a state of a substrate surface changes.

Then, the valve 39 is opened and, while ejecting a dopant solution from the nozzle 36, the nozzle 36 is slidably moved in the horizontal direction above the substrate W held on the spin chuck 32. As a result, as shown in FIG. 6A, the entire surface of the substrate W is covered with a dopant solution 103.

Figure 6B:
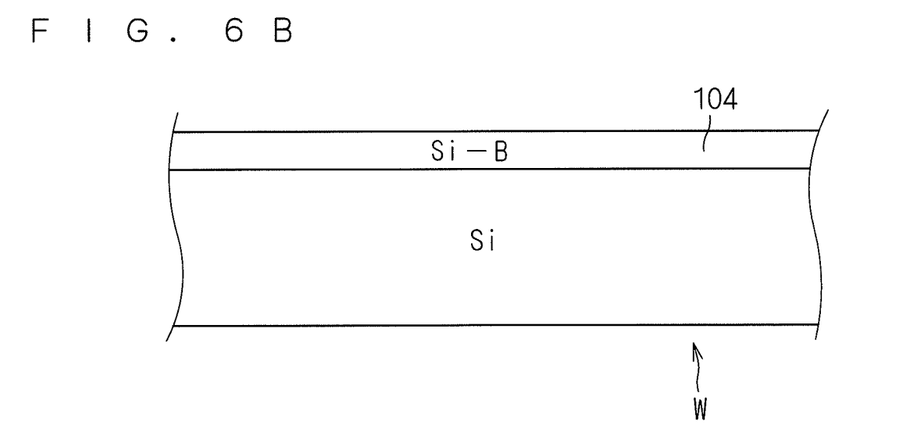

When the dopant-containing dopant solution 103 comes into contact with the hydrogen-introduced layer 102 formed on the surface of the substrate W, the hydrogen of the hydrogen-introduced layer 102 is replaced with the dopant as shown in FIG. 6B, so that the dopant is introduced into the surface of the substrate W. In this embodiment, the hydrogen-introduced layer 102 has a thickness of about 2 to 3 nm, and thus, the dopant is introduced into the portion of the substrate W with a depth of 2 to 3 nm from the surface. In other words, a dopant-introduced layer 104 having a thickness of 2 to 3 nm is formed on the surface of the substrate W.

In this process of supplying a dopant solution, a dopant solution may be continuously supplied form the nozzle 36 to the surface of the substrate W, or the substrate W may be rotated by the spin chuck 32, as long as the surface of the substrate W is covered with the dopant solution. After a lapse of a predetermined time from starting supplying a dopant solution to the surface of the substrate W, the number of revolutions of the spin chuck 32 is increased, so that the dopant solution is drained out from the surface of the substrate W by the centrifugal force. The dopant solution sprayed from the rim portion of the substrate W is collected by the cup 35.

Then, the substrate W containing a dopant introduced into its surface is transported to the flash lamp annealer 40, and flash heating is performed by emitting a flashing light to the surface of the substrate W (Step S3). The substrate W, into which a dopant has been introduced through a liquid treatment by the liquid supply apparatus 30, is transported into the housing 41 of the flash lamp annealer 40 to be mounted on the upper surface of the mounting table 44. The temperature of the mounting table 44 has been preliminarily raised to a predetermined temperature by a built-in heater, so that the substrate W mounted on the mounting table 44 is preheated (assisted heating) to a predetermined temperature.

Then, as soon as a predetermined time period has elapsed after the substrate W reached a predetermined preheating temperature, the flash lamps FL emit flashing lights toward the substrate W, so that flash heating is performed. The flashing lights emitted from the flash lamps FL are intense flashes of light whose illumination time period is extremely short, such as 0.1 millisecond or more and 100 milliseconds or less, in which the restored electrostatic energy is converted into an extremely short optical pulse. Through the emission of flashing lights, the temperature of the surface of the substrate W including the dopant-introduced layer 104 instantaneously rises to a target temperature, and then, rapidly drops to the preheating temperature.

Raising the temperature of the dopant-introduced layer 104 for an extremely short period of time as described above enables the activation of the introduced dopant. Meanwhile, diffusing a dopant takes a long period of time compared with activating a dopant. Therefore, if the temperature of the dopant-introduced layer 104 is raised to the target temperature for an extremely short period of time, a dopant will not diffuse outward. In other words, the irradiation time of a flashing light is an extremely short period of time, 0.1 millisecond or more and 100 milliseconds or less, and thus, the activation of a dopant is enabled while suppressing the dopant from diffusing outward.

After the completion of flash heating, the substrate W is transported out of the flash lamp annealer 40. Then, a series of dopant introducing processes is completed.

In this embodiment, the substrate W having the native oxide film 101 formed on its surface is heated at 600° C. or higher and 1300° C. or lower for 30 minutes or more and 60 minutes or less in a hydrogen atmosphere, thereby reducing silicon dioxide with hydrogen. Additionally, the silicon near the interface between the native oxide film 101 and the underlying silicon is hydrogen-terminated. As a result, the hydrogen-introduced layer 102 containing silicon bonded to hydrogen is formed on the surface of the substrate W. The dopant solution is then supplied to the surface of the substrate W having the hydrogen-introduced layer 102 formed thereon, and the hydrogen in the hydrogen-introduced layer 102 is replaced with a dopant, so that the hydrogen-introduced layer 102 turns into a dopant-introduced layer 104. In other words, the dopant is introduced into the surface of the substrate W.

The hydrogen-introduced layer 102, which is formed by annealing the substrate W having the native oxide film 101 formed thereon in a hydrogen atmosphere, has a thickness of about 2 to 3 nm substantially comparable to that of the native oxide film 101. This enables the hydrogen-introduced layer 102 to have a large thickness compared with the conventional case in which a native oxide film is removed with a dilute hydrofluoric acid and then the hydrogen termination is performed. In other words, hydrogen can be uniformly introduced into a deep portion of the substrate W from the surface. It should be noted that the "deep portion" means a deep portion compared with a conventional case, and it is about 2 to 3 nm from the surface of the substrate W.

Supplying a dopant solution to the surface of the substrate W having the hydrogen-introduced layer 102 formed thereon, which is thick compared with a conventional case, increases the thickness of the dopant-introduced layer 104 as well, leading to an increase in the introduction amount of a dopant. The dopant is uniformly introduced into the portion of the substrate W with a predetermined depth from the surface.

After that, flashing lights are emitted to the surface of the substrate W, containing the dopant that has been introduced deep and uniformly compared with a conventional case, for a irradiation time of 0.1 millisecond or more and 100 milliseconds or less, thereby activating the dopant while suppressing the dopant from diffusing outward.

While the embodiment of the present invention has been shown and described, numerous modifications and variations can be devised without departing from the scope of the invention. For example, the configuration of the atmosphere furnace 10 is not limited to the configuration of FIG. 1, and any configuration is adoptable as long as it can heat the substrate W at 600° C. or higher and 1300° C. or lower for 30 minutes or more and 60 minutes or less in a hydrogen atmosphere. One heat treatment takes 30 minutes or more and 60 minutes or less, and thus, the atmosphere furnace 10 is preferably of a model that simultaneously houses a plurality of substrates W for annealing.

The configuration of the liquid supply apparatus 30 is not limited to the configuration of FIG. 2, and any configuration is adoptable as long as it can supply a dopant solution to the surface of the substrate W to cover the surface with the dopant solution. The liquid supply apparatus 30 may be a batch apparatus that collectively immerses a plurality of substrates W in a dopant solution stored in a treatment vessel.

Hydrogens in the present invention include so-called light hydrogen (H) as well as deuterium (D) and tritium (T). The substrate W having the native oxide film 101 formed thereon is annealed in the atmosphere containing gaseous deuterium or gaseous tritium, efficiently reducing the silicon dioxide in the native oxide film 101.

In the embodiment above, a gas mixture of a hydrogen gas and a helium gas is supplied to the treatment space 15 in the reaction vessel 11, which is not limited thereto. For example, a gas mixture of a hydrogen gas and an argon gas (Ar) may be supplied. A gas mixture of a hydrogen gas and a nitrogen gas ($N_2$) may be supplied to the treatment space 15. Heating the substrate W to a high temperature around 1300° C. may lead to a risk that a nitrogen compound will be formed, and thus, a gas mixture of a hydrogen gas and a noble gas such as a helium gas or argon gas is preferably supplied.

In the embodiment above, the hydrogen-introduced layer 102 having a thickness of about 2 to 3 nm is formed through annealing of the substrate W in a hydrogen atmosphere. Alternatively, annealing may be performed at a high temperature of 600° C. or higher and 1300° C. or lower for a long period of time of 30 minutes or more and 60 minutes or less to bond the underlying silicon to hydrogen, so that the hydrogen-introduced layer 102 has a thickness of about 10 nm. The depth and introduction amount of a dopant to be introduced are defined in accordance with the thickness of the hydrogen-introduced layer 102. In other words, adjusting the thickness of the hydrogen-introduced layer 102 depending on the annealing state allows the dopant to be introduced into the surface of the substrate W for a required depth.

While the dopant introduced into the surface of the substrate W is activated through flash lamp annealing in the embodiment above, so-called spike anneal using halogen lamps is adoptable as long as a dopant can be prevented from diffusing outward. In addition, while a dopant is introduced by a liquid phase reaction that supplies a dopant solution to the surface of the substrate W having the hydrogen-introduced layer 102 formed thereon in the embodiment above, the dopant may be introduced into the surface of the substrate W by a gas phase reaction.

The dopant solution is not limited to a chemical solution containing boron, and any dopant solution is selectable depending on the type of the dopant to be introduced (such as phosphorus (P) or arsenic (As)).

DESCRIPTION OF REFERENCE SIGNS 10 atmosphere furnace
11 reaction vessel
12 heating element
21 processing gas supply mechanism
22 hydrogen gas supply source
23 inert gas supply source
30 liquid supply apparatus
36 nozzle
38 dopant solution supply source
40 flash lamp annealer
101 native oxide film
102 hydrogen-introduced layer
103 dopant solution
104 dopant-introduced layer
FL flash lamp
W substrate

The invention claimed is:

1. A substrate treatment method for introducing a dopant into a surface of a silicon substrate, the method comprising:
   a hydrogen annealing step of heating a substrate having an oxide film formed on a surface thereof in a hydrogen-containing atmosphere with the oxide film remaining thereon to reduce said oxide film with hydrogen and hydrogen-terminate silicon at an interface between said oxide film and said substrate; and
   an introduction step of supplying a chemical solution containing a dopant to the surface of said substrate to introduce the dopant into said surface after said hydrogen annealing step.

2. The substrate treatment method according to claim 1, wherein said hydrogen annealing step heats a substrate having an oxide film formed on a surface thereof at 600° C. or higher and 1300° C. or lower for 30 minutes or more and 60 minutes or less in an atmosphere having a hydrogen concentration of 4% or higher and 10% or lower.

3. The substrate treatment method according to claim 1, wherein said hydrogen is deuterium.

4. The substrate treatment method according to claim 1, further comprising an activation step of emitting a flashing light to the surface of said substrate to activate the introduced dopant after said introduction step.

* * * * *